United States Patent [19]

Rowe

[11] Patent Number: 5,093,283
[45] Date of Patent: Mar. 3, 1992

[54] METHOD OF MANUFACTURING A SEMICONDUCTOR DEVICE

[75] Inventor: Colin M. Rowe, Stockport, England

[73] Assignee: U.S. Philips Corporation, New York, N.Y.

[21] Appl. No.: 701,552

[22] Filed: May 16, 1991

[30] Foreign Application Priority Data

Jun. 20, 1990 [GB] United Kingdom ............... 9013787

[51] Int. Cl.[5] ............................................. H01L 21/47
[52] U.S. Cl. ................................. 437/229; 437/235; 437/73; 437/238; 148/DIG. 137; 156/659.1
[58] Field of Search ............... 437/229, 233, 235, 238, 437/982, 928; 148/DIG. 137, DIG. 133; 156/659.1, 661.1, 644

[56] References Cited

U.S. PATENT DOCUMENTS

| | | | |
|---|---|---|---|
| 3,578,515 | 5/1971 | Borrello et al. | 437/229 |
| 3,639,186 | 2/1972 | Forster et al. | 148/DIG. 118 |
| 4,354,896 | 10/1982 | Hunter et al. | 437/228 |
| 4,497,684 | 2/1985 | Sebesta | 437/228 |
| 4,866,004 | 9/1989 | Fukushima | 437/228 |
| 4,892,838 | 1/1990 | Fisher et al. | 437/235 |
| 4,946,804 | 8/1990 | Pritchard et al. | 437/228 |
| 5,032,541 | 7/1991 | Sakamoto et al. | 437/228 |

FOREIGN PATENT DOCUMENTS 0084520 4/1987 Japan ................... 437/228

Primary Examiner—Brain E. Hearn
Assistant Examiner—Michael Trinh
Attorney, Agent, or Firm—Paul R. Miller

[57] ABSTRACT

A surface layer (10), for example oxide, is provided on a first major surface (2) of a semiconductor body (1). A masking layer (11) having at least one window (12) is defined on the surface layer (10). The surface layer (10) and the semiconductor body (1) are etched through the window (12) to define an opening (13 in the surface layer (10) and a recess (14) within the semiconductor body (1) extending beneath the surface layer (10) so that a rim portion (10a) of the surface layer (10) overhangs the recess (14). The rim portion (10a) of the surface layer (10) is removed by causing a settable flowable material (15) to flow onto the surface layer (10) and into the recess (14) and then causing the flowable material to set and thereby change volume to apply a force for causing the rim portion (10a) to break away from the remainder (10b) of the surface layer (10). The set flowable material (150) and thus the rim portion (10a) of the surface layer (10) are then removed. The recess (14) may form a passivation moat bounding a pn junction (5a) and may subsequently be provided with a glass passivating layer (8).

11 Claims, 3 Drawing Sheets

METHOD OF MANUFACTURING A SEMICONDUCTOR DEVICE

DESCRIPTION

This invention relates to a method of manufacturing a semiconductor device and especially, but not exclusively, to a method of passivating a pn junction within a semiconductor device.

British patent application GB-A-1293807 describes a method of manufacturing a semiconductor device, which method comprises providing a semiconductor body having first and second major surfaces, providing a surface layer of different material on the first major surface, defining a masking layer having at least one window on the surface layer, etching the surface layer and the semiconductor body through the window to define an opening in the surface layer and a recess within the semiconductor body extending beneath the surface layer so that a rim portion of the surface layer overhangs the recess, removing the masking layer, and removing the rim portion of the surface layer.

As described in GB-A-1293807, the surface layer is an oxide layer provided over a device area formed within the semiconductor body and the recess is etched to form a groove bounding the device area so that a pn junction within the device area is terminated by the groove. The surface of the groove is passivated by a layer of glass deposited by electrophoresis.

The etching of the groove leaves a lip or rim portion of the oxide layer overhanging the groove. Generally, the presence of such lip or rim portions will in any case result in poor coverage by, and possibly breaks in, any subsequent layer so that normally it is desirable to remove the lip or rim portion prior to providing any subsequent layer.

In the examples described in GB-A-1293807, the oxide lip is removed either by placing the semiconductor bodies or wafers in an inert fluid such as deionized water or alcohol and subjecting the wafers to ultrasonic vibration, or by manually removing the oxide lip by lightly brushing the surface. The first of these methods requires the wafers to be subjected to a further treatment which is not normally part of the processing while the second method is heavily reliant on the skill and dexterity of the person concerned.

It is an aim of the present invention to provide a method of manufacturing a semiconductor device in which the rim portion overhanging the recess may be removed by a method which is not reliant on the skill and dexterity of an operator and which moreover does not require the use of additional special treatments such as ultrasonic baths.

According to the present invention, there is provided a method of manufacturing a semiconductor device, which method comprises providing a semiconductor body having first and second major surfaces, providing a surface layer of different material on the first major surface, defining a masking layer having at least one window on the surface layer, etching the surface layer and the semiconductor body through the window to define an opening in the surface layer and a recess within the semiconductor body extending beneath the surface layer so that a rim portion of the surface layer overhangs the recess, removing the masking layer, and removing the rim portion of the surface layer, characterised by removing the rim portion of the surface layer by causing a settable flowable material which changes volume upon setting to flow onto the surface layer and into the recess so that the rim portion is immersed within the flowable material, causing the flowable material to set and thereby change volume so applying to the rim portion a force for causing the rim portion to break away from the remainder of the surface layer, and then removing the set flowable material and thus the rim portion of the surface layer.

Thus, in a method in accordance with the invention, the rim portion may be removed by simply causing a flowable settable material applied to the first major surface to set so as to apply a force to the rim portion which results in the rim portion breaking away from the remainder of the surface layer and which enables the rim portion then to be removed with the set flowable material. The flowable material may be any suitable material generally available for semiconductor processing so that, accordingly, using a method in accordance with the invention should be significantly more cost-effective than the previously proposed methods described above. Typically a conventional resist material such as, for example, Waycoat '450' Cp negative resist, which may be set using a heat treatment process generally available within the semiconductor processing operation, can be used as the flowable material. In certain circumstances, the set flowable material may then later be used as a protective mask, for example during processing connected with the second major surface. The surface layer may be rinsed with a wetting agent such as, for example, Xylene where the settable flowable material is a resist.

Generally, the surface layer may be an insulating layer, for example an oxide layer, and a further layer may be provided to cover the surface of the recess after removal of the rim portion. The further layer may be a passivating layer for relieving the electric field at a pn junction where the recess is in the form of a groove bounding a device region of the semiconductor body so that a pn junction, for example between the base and collector region of a bipolar transistor, terminates at the groove.

Embodiments of the invention will now be described, by way of example, with reference to the accompanying drawings, in which.

Figure 1:
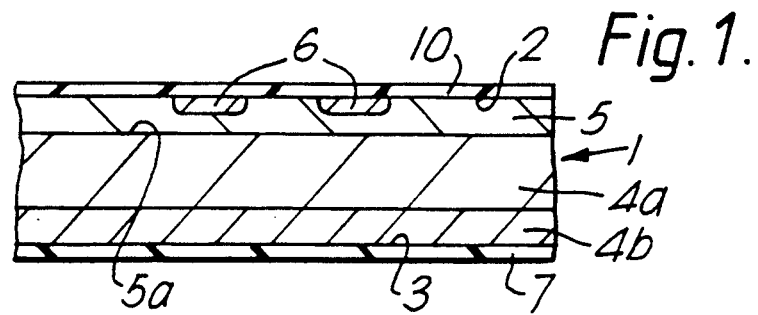
FIG. 1 is a cross-sectional view of a semiconductor body in which device regions have been provided for manufacturing a semiconductor device, in the example shown a vertical bipolar transistor, using a method in accordance with the invention.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Referring now to the drawings, in particular FIGS. 1 to 8, there is illustrated a method of manufacturing a semiconductor device 100, which method comprises providing a semiconductor body 1 having first and second major surfaces 2 and 3, providing a surface layer 10 of different material on the first major surface 2, defining a masking layer 11 having at least one window 12 on the surface layer 10, etching the surface layer 10 and the semiconductor body 1 through the window 12 to define an opening 13 in the surface layer 10 and a recess 14 within the semiconductor body 1 extending beneath the surface layer 10 so that a rim portion 10a of the surface layer 10 overhangs the recess 14, removing the masking layer 11, and removing the rim portion 10a of the surface layer 10.

Figure 5:
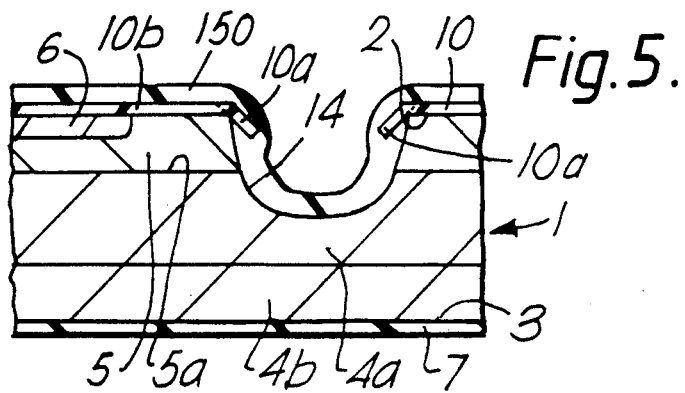

In accordance with the invention, the rim portion 10a of the surface layer 10 is removed by causing a settable flowable material 15 which changes volume upon setting to flow onto the surface layer 10 and into the recess 14 so that the rim portion 10a is immersed within the flowable material 15, causing the flowable material to set and thereby change volume so applying a force for causing the rim portion 10a to break away from the remainder 10b of the surface layer 10, and then removing the set flowable material 150 see FIG. 5 and thus the rim portion 10a of the surface layer 10.

The rim portion 10a may thus be removed by simply causing a flowable settable material, such as a resist which is readily available with a semiconductor device manufacturing facility to set, for example by baking the resist, so as to cause the resist to change volume and so apply a force to the rim portion 10a causing it to break away from the remainder 10b.

A specific example of a method in accordance with the invention for manufacturing a vertical bipolar transistor, that is a bipolar transistor in which the main current path is between rather than along the major surfaces 2 and 3, will now be described with reference to FIGS. 1 to 8.

In this example, the semiconductor body 1 comprises a lowly doped n conductivity type monocrystalline silicon substrate which will form a first portion 4a of the collector region 4 of the bipolar transistor. The substrate 4a may have a resistance of typically 100 ohm-cm and a thickness of 110 μm (micrometers). The doping of a layer 4b of the collector region 4 adjacent the second major surface 3 is increased by diffusion of n conductivity type impurities to enable good ohmic contact by the eventual collector metallisation.

A base region 5 of the opposite conductivity type to the collector region 4, that is of p conductivity type, is formed by the introduction, for example by diffusion, of impurities of p conductivity type, for example boron, into the first major surface 2. In the example shown, the boron is introduced into the entire surface area of the first major surface 2. However, the base region 5 may be provided as a planar region, in which case, before introduction of the p conductivity type impurities, a layer of silicon dioxide is thermally grown on the first major surface 2 and a window opened, using conventional photolithographic and etching techniques, in the oxide layer to provide a mask for the boron introduction. The base region 5 may have, typically, a depth or thickness of 25 μm and a surface dopant concentration of $1 \times 10^{18}$ atoms cm$^{-2}$.

Thermal oxide is then grown onto the first major surface 2 and a window or windows opened to enable the introduction of n conductivity type impurities, in this example phosphorus, to provide an emitter region 6 of the bipolar transistor. The emitter region 6 may be of any suitable desired pattern, for example an emitter finger or stripe pattern (only two fingers are shown in the Figures although there may be many more), a comb-like pattern or a grid-like pattern. The emitter region 6 may have, for example, a depth of 8 μm with a surface dopant concentration of about $5 \times 10^{20}$ atoms cm$^{-2}$.

The introduction of the impurities to form the emitter region 6 may be carried out in such a manner that a silicon oxide layer grows over the emitter regions 6 to fill the windows opened in the thermal oxide. If this is the case, then the thermal oxide and the regrown oxide formed during introduction of the impurities to form the emitter region 6 may provide the layer 10 of different material which in this case is an insulating layer. However, the thermal oxide may be removed or supplemented by a deposited silicon oxide layer so as to complete the insulating layer 10. Typically, the insulating layer 10 may have a thickness of in the region of 1 to 1.5 μm (micrometers).

A layer 7 of silicon oxide on the second major surface 3 protects that surface during the further processing to be described below.

Figure 2:
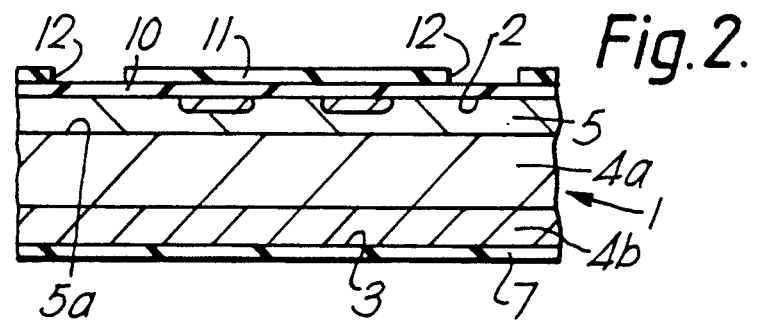
FIG. 2 is a cross-sectional view, similar to FIG. 1, illustrating a further step in a method in accordance with the invention.

Having formed the structure shown in FIG. 1, the masking layer 11, which is typically a photosensitive resist layer, is then provided on the insulating layer 10 and patterned using conventional techniques to define the window or windows 12 as shown in FIG. 2 through which the insulating layer 10 and semiconductor body 1 are to be etched.

The silicon oxide insulating layer 10 is then etched using conventional techniques to define the opening 13. The semiconductor body 1 is then etched isotropically via the window 12 and the opening 13 so as to define the recess 14. The masking layer 11 is then removed using conventional techniques.

In this example, the recess 14 forms a passivation groove bounding a semiconductor device area, in particular terminating the pn junction 5a defined between the collector region 4a and the base region 5. The groove 14 may have a depth of, for example, 60 to 75 μm depending primarily of course on the depth of the base and collector regions 5 and 4a.

Figure 3:
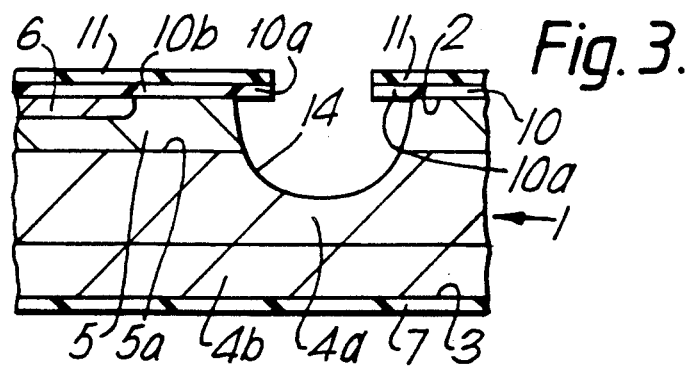
FIGS. 3, 4, 5, 6 and 7 are enlarged cross-sectional views of part of the semiconductor body shown in FIG. 1 for illustrating steps in a method in accordance with the invention following the step shown in FIG. 2.

The etchant used to form the recess 14 acts isotropically so that the recess 14 is etched both downwardly and laterally thereby also removing semiconductor material beneath the rim portion 10a of the insulating layer 10. Thus, the insulating layer 10 is undercut leaving, as illustrated in FIG. 3, the rim portion 10a overhanging the recess 14.

The overhanging rim portion 10a of the insulating layer 10 makes subsequent coverage of the now-defined surface including the recess 14 by further layers of material difficult and accordingly this overhanging rim portion 10a has to be removed.

As described above, and as shown in FIG. 4, a settable flowable material 15 which changes volume upon setting is caused to flow onto the surface layer 10 and into the recess 14 so that the rim portion 10a is immersed within the flowable material 15, the flowable material 15 is then caused to set so applying a force to the rim portion 10a causing it to break away from the remainder 10b of the surface layer 10. In this example, the flowable settable material 15 is a conventional resist material, such as Waycoat 450 Cp negative resist. Where it is later desired for the set flowable material 150 to act as a protective mask during, for example, the removal of the oxide layer 7 from the second major surface 3, then, prior to applying the resist, the semiconductor body 1 may be subjected to a conventional pretreatment which acts to improve the adhesion of the flowable material 15. Thus, for example, the semiconductor body 1 may be subjected to a bake-prime-bake treatment in which the priming step exposes the surface layer 10 and recess 14 to a conventional gaseous composition which acts on the surface to increase its adhesion to the subsequently applied flowable material 15. The surface layer 10 may then be rinsed with a wetting agent such as, for example, Xylene to improve the coverage by the flowable material 15.

Figure 4:
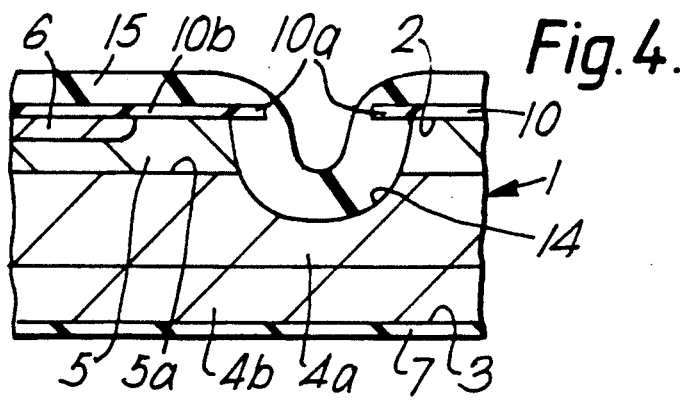

Preferably, as much resist as possible is spun onto the surface layer 10 with a final spin speed of about 1.5–2.0 krpm for about 3 seconds so that a thickness of about, typically, 2.0 μm is achieved on the surface of the insulating layer 10. As illustrated in FIG. 4, the overhanging rim portion 10a of the insulating layer 10 is thus immersed in the resist material 15.

The resist layer 15 is then subjected to a heating or baking treatment. In this example, the resist layer 15 is first heated using infra-red heating means for from about 5 to 20 minutes and then baked in a conventional oven at 120° C. for about 20 minutes. This heat treatment causes the resist to set or cure during which the volume of the resist layer 15 changes, in this example shrinks, so applying a force to the overhanging rim portion 10a and causing it to break away from the remainder 10b of the insulating layer 10. FIG. 5 shows, schematically, the rim portion 10a being bent under the force applied by the setting resist layer 150 causing the rim portion 10a to snap off. Thus, a material, such as a resist, which is readily available and commonly used in semiconductor device processing may be used to provide the flowable material 15. This allows the rim portion 10a to be removed in a manner which is both simple and cost effective without having to resort to techniques and materials which are not readily available.

The silicon oxide insulating layer 7 is then removed from the rear or second major surface 3 using conventional means. The set flowable material 150 acts, in this example, as a protective mask to protect the surface layer 10 and the recess 14 during the removal of the insulating layer 7.

Figure 6:
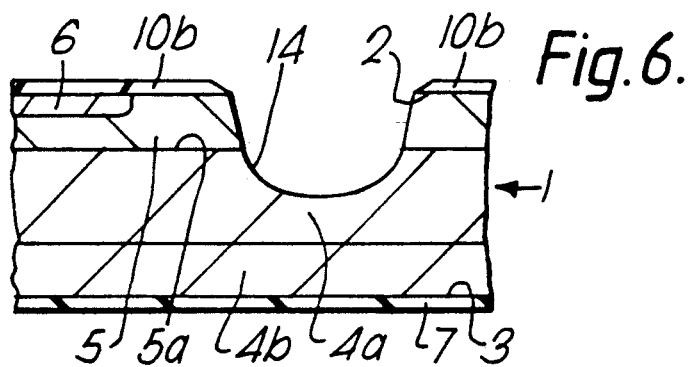

The set resist material 150 is then removed by conventional means, for example, fuming nitric acid followed by a short plasma etch, removing at the same time the rim portion 10a which has been broken away from the remainder 10b of the insulating layer 10 to leave the structure shown in FIG. 6 which provides a relatively smooth surface over which subsequent layers can be provided.

In this example, as mentioned above, the recess 14 provides a passivating groove which terminates the base-collector pn junction 5a. Accordingly, a passivating layer 8 may now be provided within the groove 14. Any suitable conventional passivating materials, such as a glass passivating material, may be used.

In this example, the passivating layer 8 is formed by electrophoretic deposition of a glass material which, as described in for example GB-A-1293807, selectively deposits glass onto the areas of semiconductors exposed at the first major surface 2, that is onto the surface of the recess 14.

Figure 7:
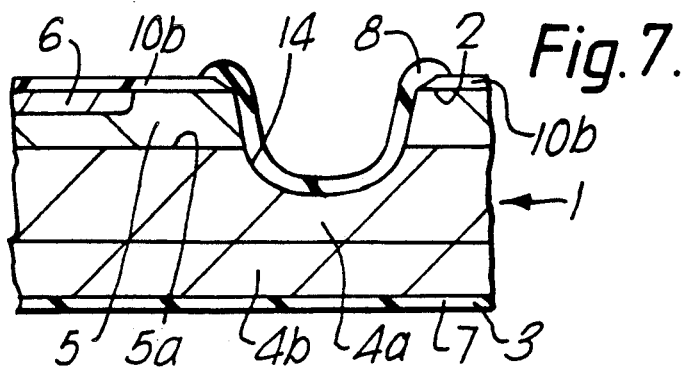
Figure 8:
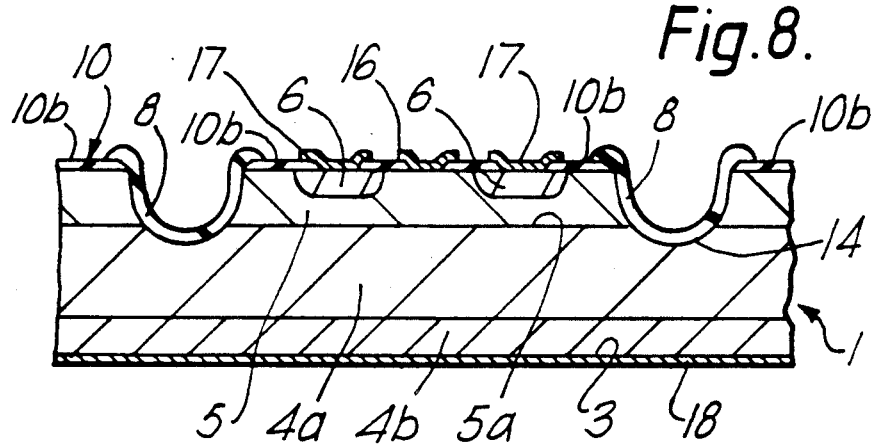
FIG. 8 is a cross-sectional view of a semiconductor device, as shown a vertical bipolar transistor, manufactured using the method illustrated by FIGS. 1 to 7.

After the glass material has been fired to produce the passivating layer 8 shown in FIG. 7, emitter and base contact windows are opened using conventional techniques and metallisation deposited to provide as shown in FIG. 8 base and emitter contacts 16 and 17 and a collector contact 18 on the second region surface 3 to form the vertical bipolar transistor 100 shown in FIG. 8.

Where the passivating layer 8 is provided by a selective deposition process such as electrophoresis and so is only deposited where desired as shown in FIG. 7, the passivating layer 8 may be used as at least part of the mask for defining the contact windows for subsequent matallisation thereby enabling the metallisation to extend up to the edge of the passivating layer 8. This may be particularly advantageous where the semiconductor device is, for example, an epitaxial diode and a continuous metallisation contact is required over the entire area of the first major surface 2 bounded by the groove or recess 14. The use of the passivating layer 8 to define at least part of the contact window mask should enable alignment tolerances to be reduced which may enable a greater packing density and so allow a larger number of devices to be produced from a given size of semiconductor wafer.

Figure 9:
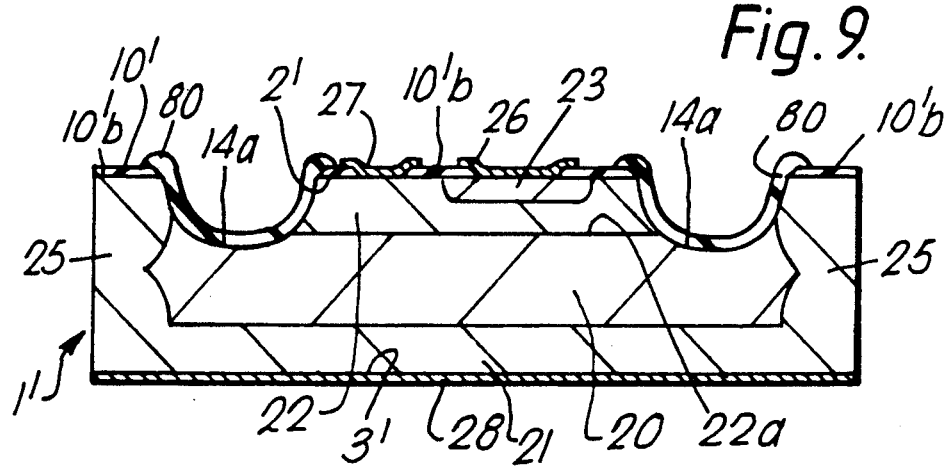
FIG. 9 is a cross-sectional view of a different semiconductor device which may be manufactured using a method in accordance with the invention.

The method may also be applied to the manufacture of the types of devices disclosed in GB-A-1536545, for example to thyristor or triac structures. Thus, FIG. 9 illustrates a thyristor 101 manufactured using a method in accordance with the invention.

The thyristor comprises a semiconductor body 1' formed by a monocrystalline silicon substrate 20 doped with impurities of the one conductivity type, n conductivity type in this example to form the n base of the thyristor. Impurities of the opposite conductivity type, p conductivity type in this example, are introduced into the second major surface 3' of the semiconductor body 1' to form a highly doped anode region 21 and into the first major surface 2' to form a planar p base region 22. The n conductivity type cathode or emitter region 23 of the thyristor is formed in known manner as described in GB-A-1536545. The pn junction 22a defined between the p base region 22 and the n base region 20 terminates at a moat or groove 14a. Pn junction isolation is provided at the edge of the device by deep-diffused aluminium regions 25 formed as described in GB-A-1536545.

The moat or groove 14a is provided with a passivating layer 80 which is generally a glass passivating layer similar to that descibed above with reference to FIGS. 7 and 8 and the method described above with reference to FIGS. 2 to 3 is used to ensure that any rim portion of the insulating layer 10' overhanging the moat or groove 14a is removed prior to deposition of the passivating layer 80 leaving only the remainder 10'b of the insulating layer 10'. Cathode, base and anode contacts 26, 27 and 28 are provided in conventional manner.

A method in accordance with the invention may of course be applied to other semiconductor devices where a mesa structure is to be defined to enable passivation of a pn junction which is reverse-biassed in at least one mode of operation of the device. Thus, for example, a method in accordance with the invention may be applied where the semiconductor device is an epitaxial diode.

It will, of course, be appreciated that the conductivity type given above can be reversed to produce, for example, a pnp bipolar transistor rather than the npn bipolar transistor shown in FIG. 8. Moreover, a method in accordance with the invention may be applied when the semiconductor material is other than silicon and where the semiconductor device incorporates heterojunctions, for example where the emitter region of a bipolar transistor may be formed of silicon carbide in or on a silicon base region.

In addition although the description given above applies a method in accordance with the invention to the manufacture of so-called mesa structure devices in which the recess or groove 14 is a passivating groove, a method in accordance with the invention may also be applied in other circumstances where a recess is etched into the semiconductor body through a layer of a different material which need not necessarily be an insulating layer but could be, for example, a layer of a different semiconductor material. In particular, a method in accordance with the present invention may have particular application in the formation of the groove or recess required for defining the insulated gate in a VMOS or Trenchfet type of insulated gate field effect device.

From reading the present disclosure, other modifications will be apparent to persons skilled in the art. Such modifications may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing a semiconductor device, which method comprises providing a semiconductor body having first and second major surfaces, providing a surface layer of different material on the first major surface, defining a masking layer having at least one window on the surface layer, etching the surface layer and the semiconductor body through the window to define an opening in the surface layer and a recess within the semiconductor body extending beneath the surface layer so that a rim portion of the surface layer overhangs the recess, removing the masking layer, and removing the rim portion of the surface layer, characterised by removing the rim portion of the surface layer by causing a settable flowable material which changes volume upon setting to flow onto the surface layer and into the recess so that the rim portion is immersed within the flowable material, causing the flowable material to set and thereby change volume so applying to the rim portion a force for causing the rim portion to break away from the remainder of the surface layer, and then removing the set flowable material and thus the rim portion of the surface layer.

2. A method according to claim 1, which comprises using a resist material as the settable flowable material.

3. A method according to claim 2, which comprises causing the resist material to set by heating the resist material.

4. A method according to claim 3, which comprises rinsing the surface layer with a wetting agent prior to causing the resist material to flow onto the surface layer.

5. A method according to claim 4, which comprises producing the surface layer as a layer of insulating material.

6. A method according to claim 1, which further comprises, after removing the rim portion, providing a further layer to cover the surface of the recess.

7. A method according to claim 6, which comprises providing the further layer as a passivating layer.

8. A method according to claim 7, which comprises defining the recess as a groove bounding a device region of the semiconductor body.

9. A method according to claim 8, which comprises defining the recess as a groove bounding a base region of a bipolar transistor structure formed within the semiconductor body.

10. A method according to claim 2, which comprises rinsing the surface layer with a wetting agent prior to causing the resist material to flow onto the surface layer.

11. A method according to claim 1, which comprises producing the surface layer as a layer of insulating material.

* * * * *